(12) United States Patent
Tarumizu

(10) Patent No.: US 7,296,421 B2
(45) Date of Patent: Nov. 20, 2007

(54) PROTECTING METHOD OF ARTICLE

(75) Inventor: Yoshitaka Tarumizu, Yokohama (JP)

(73) Assignee: Eminent Supply Corporation, Tokyo (JP)

( * ) Notice: Subject to any disclaimer, the term of this patent is extended or adjusted under 35 U.S.C. 154(b) by 283 days.

(21) Appl. No.: 11/198,472

(22) Filed: Aug. 5, 2005

(65) Prior Publication Data

US 2007/0028641 A1   Feb. 8, 2007

(51) Int. Cl.
*F25D 25/00* (2006.01)

(52) U.S. Cl. .................. 62/62; 62/64; 269/7

(58) Field of Classification Search ............... 62/62, 62/64; 269/7
See application file for complete search history.

(56) References Cited

U.S. PATENT DOCUMENTS 5,983,483 A * 11/1999 Tarumizu ............... 29/559

6,073,451 A    6/2000 Tarumizu

* cited by examiner

*Primary Examiner*—William E. Tapolcai
(74) *Attorney, Agent, or Firm*—Michael J. Striker

(57) ABSTRACT

There is provided a protecting method capable of simply and firmly protecting a required face of an article such that the required face of the article is not damaged or contaminated and capable of extremely simply carrying out a protecting step and a protection releasing step.

As means for protecting a surface of an article, there is used a macromolecular compound in a liquid state a freezing point of which exceeds that of water, a gel-like object constituted by mixing the macromolecular compound with a fine powder, or a sheet-like object impregnated or coated with the macromolecular compound in the liquid state the freezing point of which exceeds that of water or the gel-like object, a face constituting an object of protection of the article is covered thereby or a hole or a gap thereof is filled therewith, a protecting film or a protecting layer is formed by freezing the macromolecular compound by cooling, and when protection is not needed, the macromolecular compound is defrosted by elevating a temperature thereof.

7 Claims, 10 Drawing Sheets

Fig.1-A
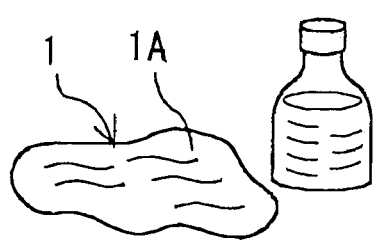
Fig.1-B
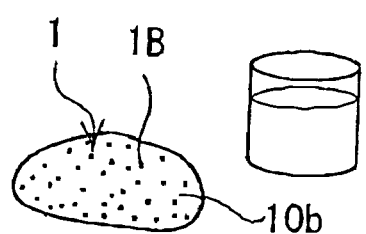
Fig.1-C
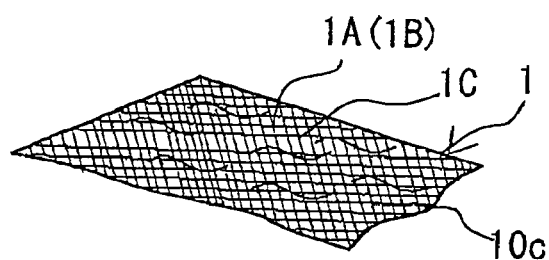
Fig.1-D
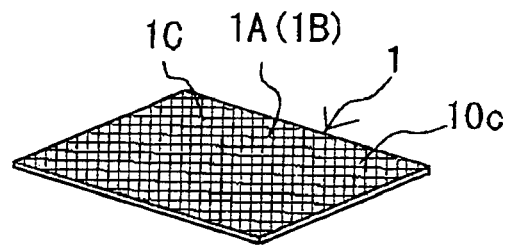

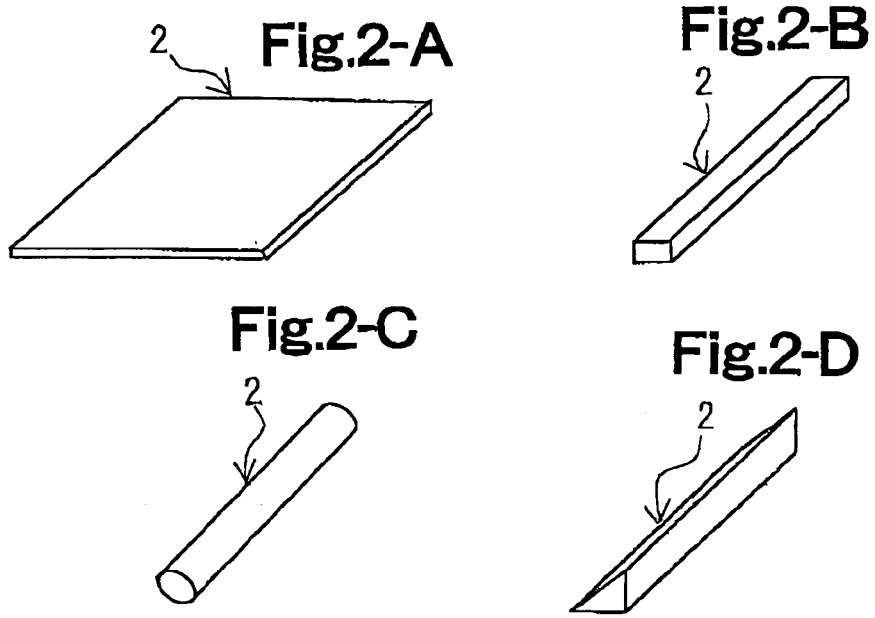
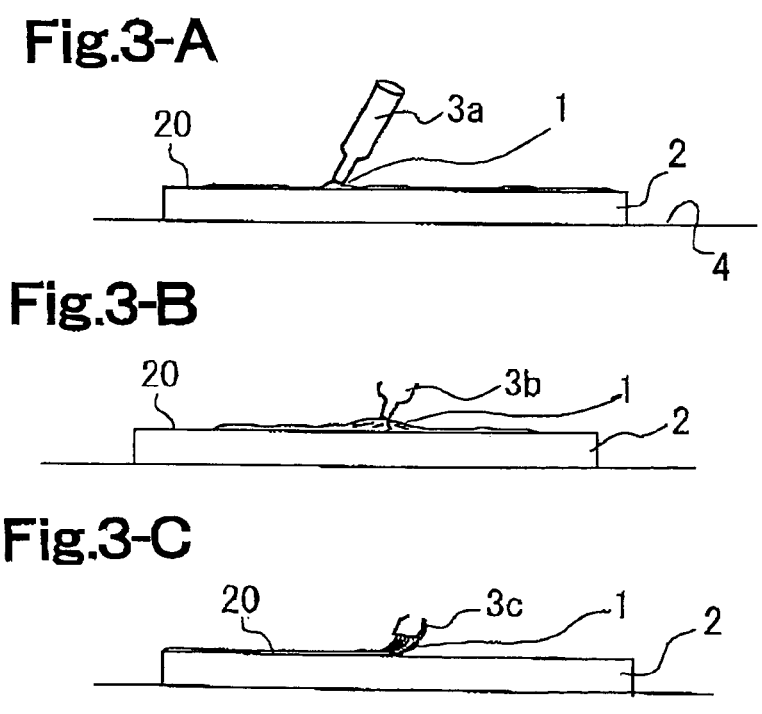
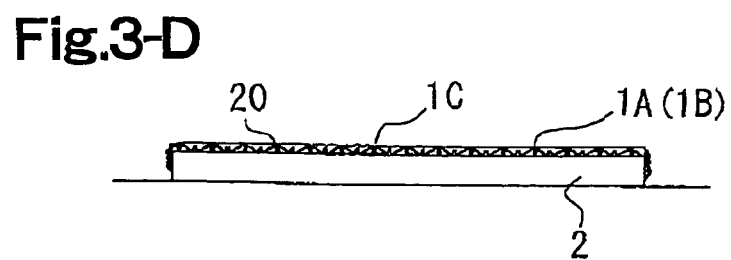

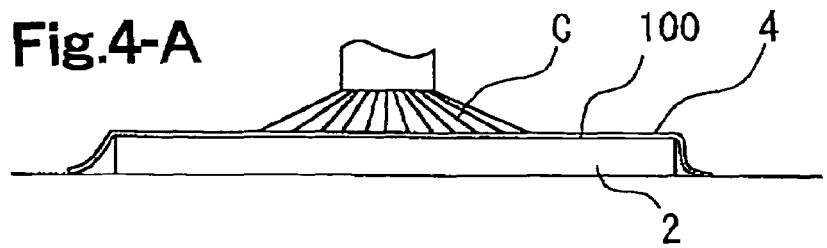
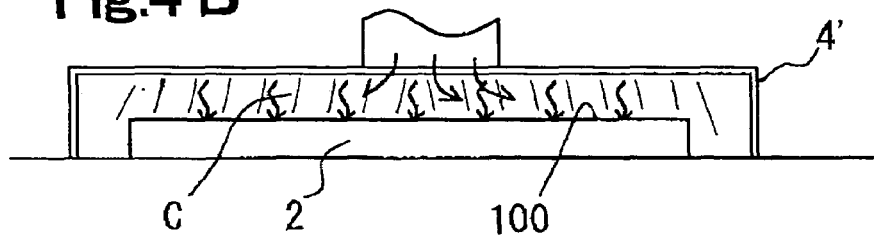
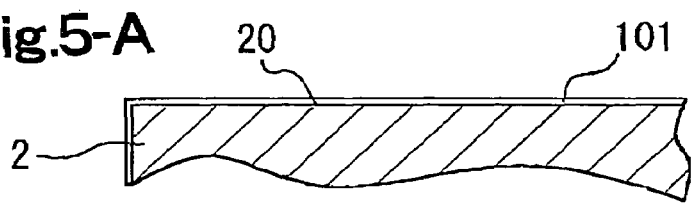
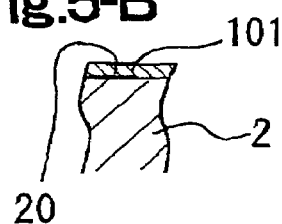
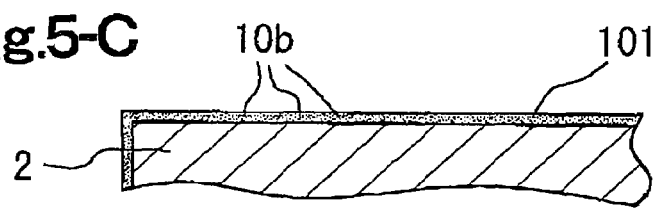
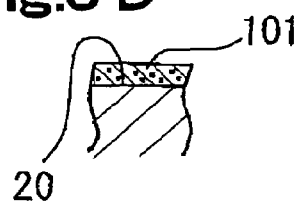
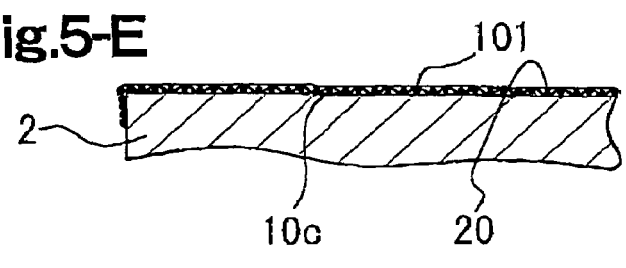
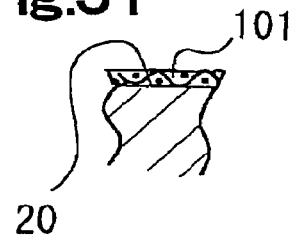

Fig.6-A
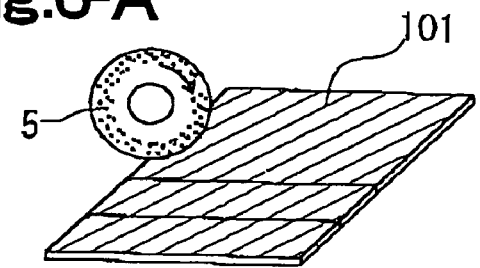
Fig.6-B
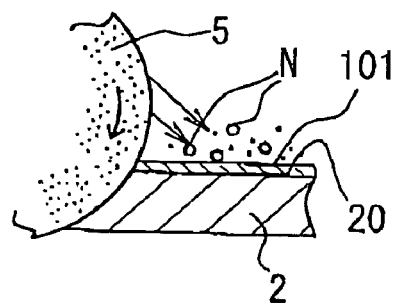
Fig.6-C
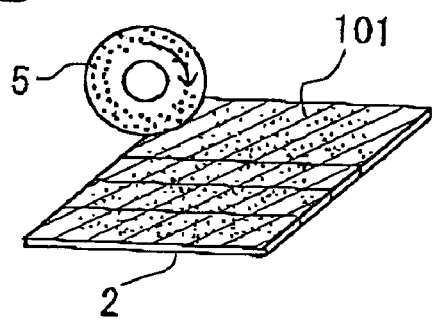
Fig.6-D
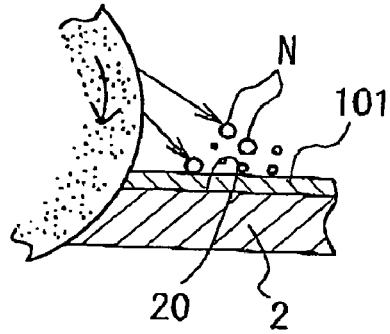
Fig.6-E
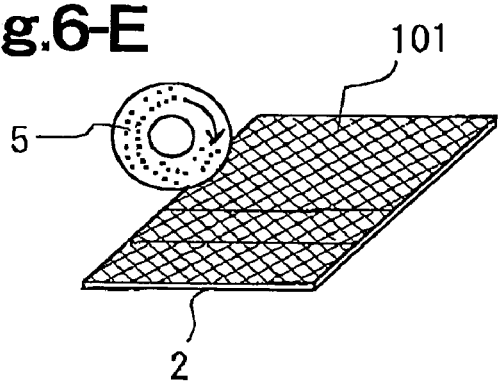
Fig.6-F
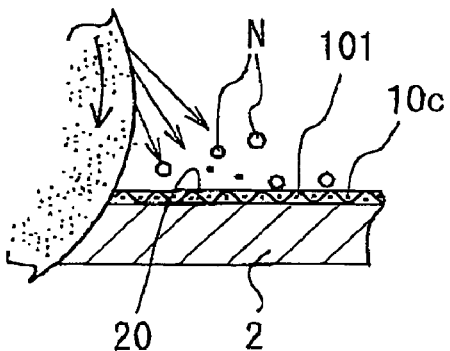
Fig.6-G
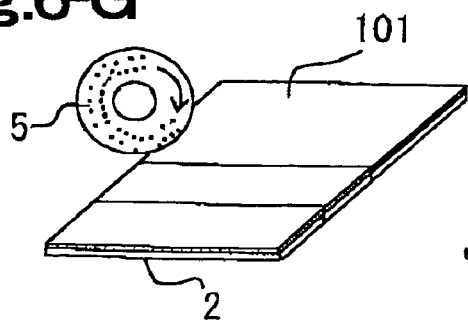
Fig.6-H
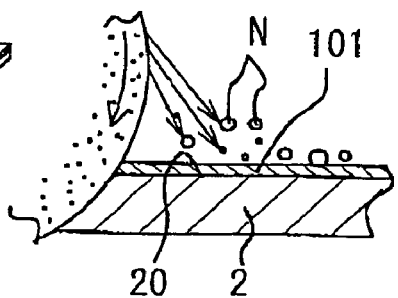

Fig.7-A
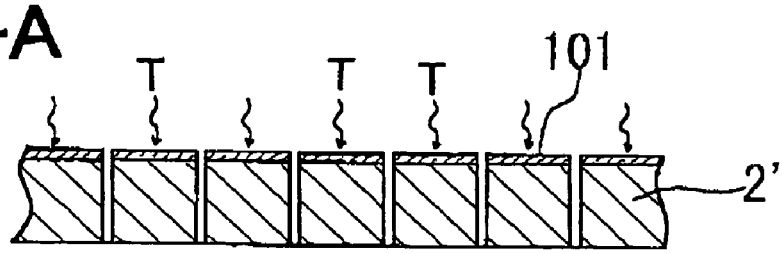
Fig.7-B
Fig.8
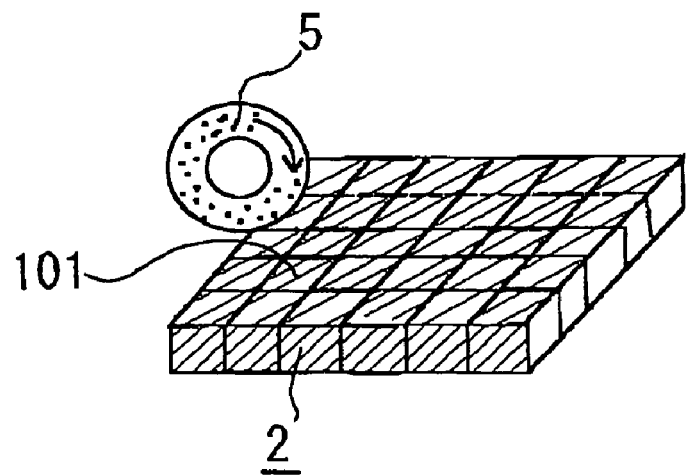

Fig.9-A
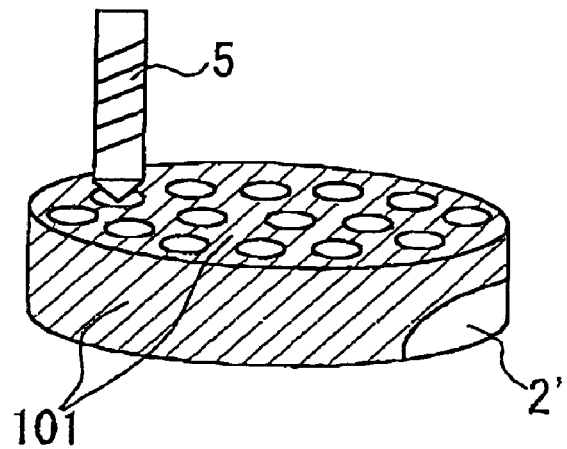
Fig.9-B
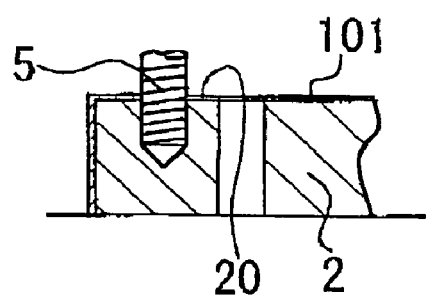
Fig.9-C
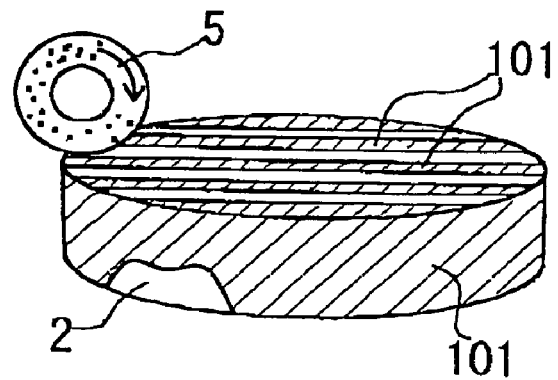

Fig.10-A
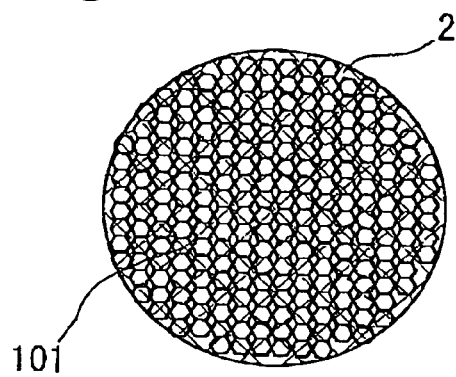
Fig.10-C
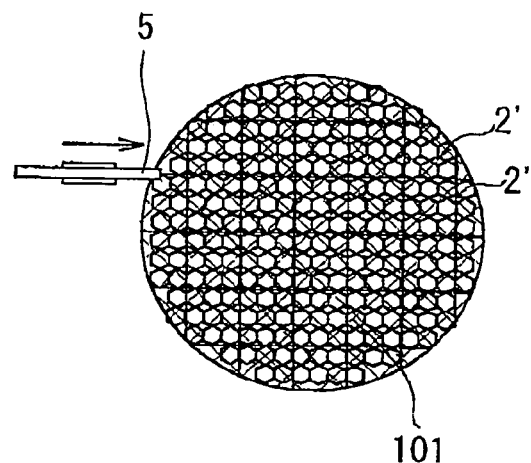
Fig.10-B
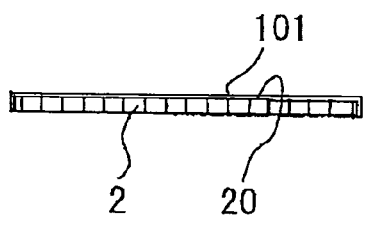
Fig.10-D
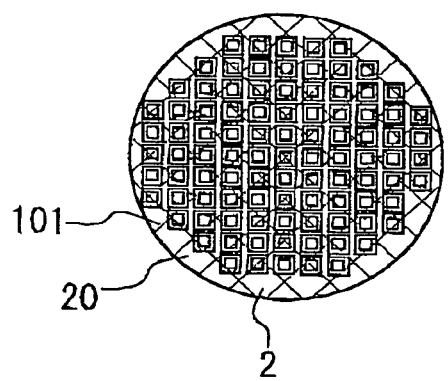

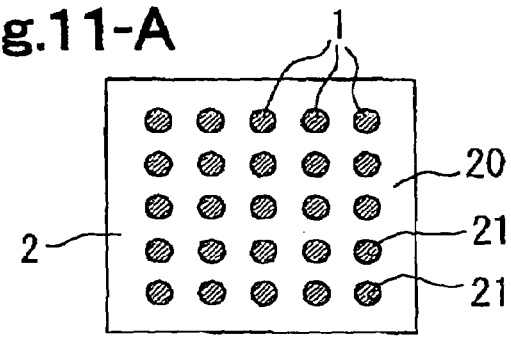
Fig.11-A
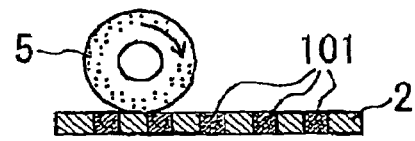
Fig.11-B
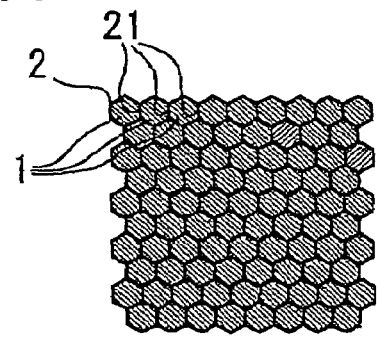
Fig.12-A
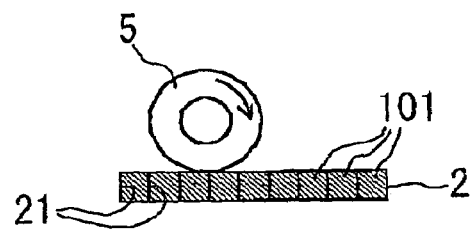
Fig.12-B
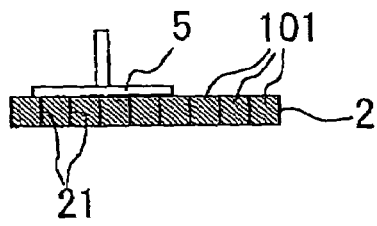
Fig.12-C

Fig.13-A
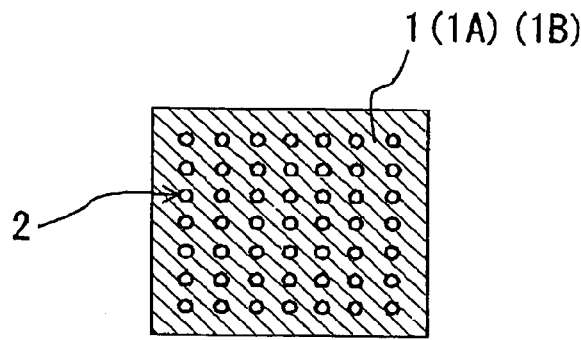
Fig.13-B
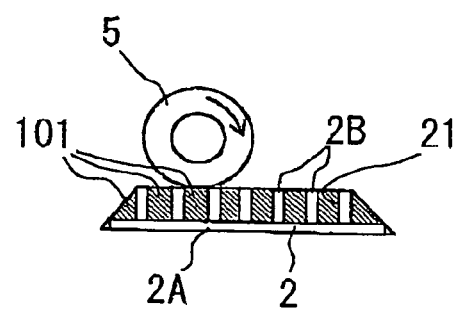
Fig.14-A
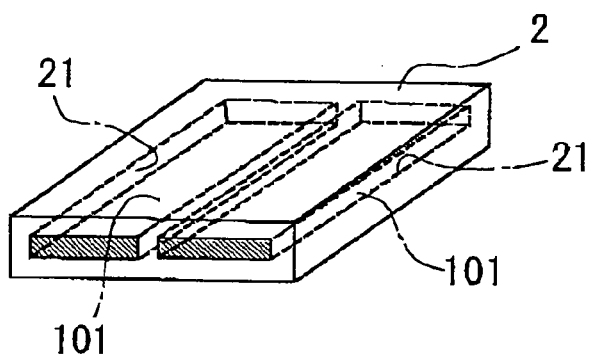
Fig.14-B
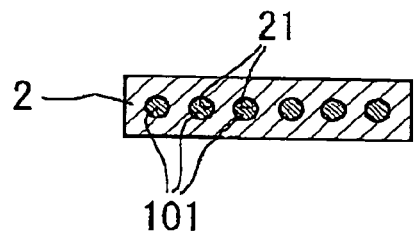

Fig.15-A
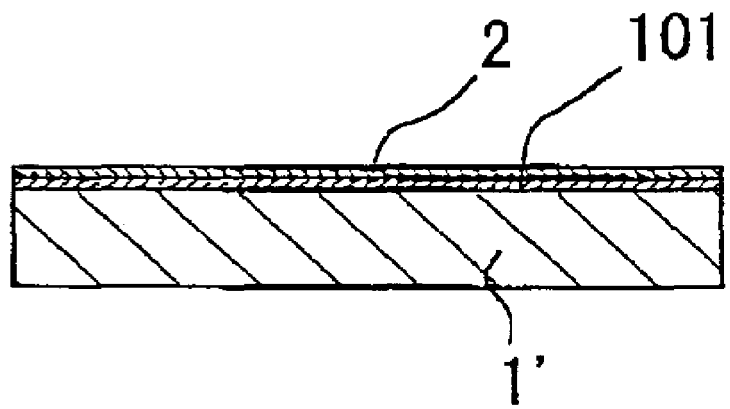
Fig.15-B
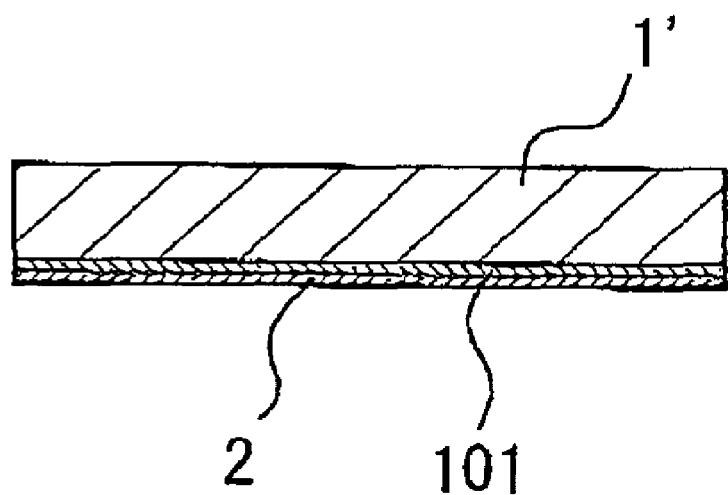

PROTECTING METHOD OF ARTICLE

FIELD OF THE INVENTION

The present invention relates to a protecting method for preventing an article from being damaged or contaminated in working the article.

BACKGROUND OF THE INVENTION

In working a nonmetallic or metallic material, a worked object is fixed onto a work table or a stage and subjected to working as desired such as polishing, cutting (slicing, dicing), boring or the like by a tool. At this occasion, a surface of the worked object is damaged by a foreign matter of work chips produced from the worked object or abrasive grains, worn powders of tool chips included in a working solution, and a product in which a mirror finish state or cleanness of a surface is requested is frequently degraded. Further, also in moving, carrying, or storing the product after having been worked, the surface is frequently contaminated or damaged by bringing dust or foreign matter into contact with the surface.

As a counter major therefor, in a background art, a surface of an object has been tried to coat with wax. However, wax needs to be once heated and melted and heated and melted again after finishing to work the worked object and therefore, the way of use thereof is poor, further, even when the melted wax is cleaned by an organic solvent, a cleaning effect thereof is difficult to be sufficient and a number of failures are liable to be brought about. Therefore, there poses a problem that cost is increased and the production efficiency is deteriorated. Further, although it is conceivable to paste protection tapes in place of the wax, the worked object is liable to be damaged or deformed in pulling to exfoliate the protection tapes, further, a residue of an adhering agent remains and the residue is difficult to be processed. Therefore, actually, in almost all the cases, the worked object is worked without protection at all and a failed product generating rate is increased.

Further, when the worked object is porous or a cavity is present at inside thereof, even in the case in which such an article is worked or moved, carried or stored after having been worked, foreign matters (work chips, abrasive grains, worn powders, dusts or the like separated from working means) invade the hole or the cavity and it is extremely difficult to evacuate the foreign matters to clean, however, there has not been means or a method of easily resolving the problem.

SUMMERY OF THE INVENTION

The invention has been carried out in order to resolve the above-described problem and it is a first object thereof to provide a method capable of firmly protecting a required face of an article such that the required face is not damaged or contaminated and is capable of extremely simply carrying out a step of protecting the required face and a step of releasing the required face from being protected.

Further, it is a second object of the invention to provide a protecting method of an article capable of firmly preventing invasion of a foreign matter, contamination or the like to a hole or a cavity when the article includes the hole or the cavity, and capable of extremely simply carrying out a step therefor, and a step of releasing the article from being protected.

In order to achieve the first object, according to the invention, there is provided a protecting method of an article, wherein in working a worked object, a face constituting an object of protection is covered by any of a macromolecular compound in a liquid state a freezing point of which exceeds a freezing point of water, a gel-like object constituted by mixing the macromolecular compound and a fine powder, or a sheet-like object impregnated or coated with the macromolecular compound in the liquid state the freezing point of which exceeds the freezing point of water or the gel-like object, and a protecting film or a protecting layer in a solid phase against damage or contamination by an foreign matter is formed by freezing the macromolecular compound.

Further, in order to achieve the second object, according to the invention, there is provided a protecting method of an article, wherein in working a worked object having a hole or a cavity at inside thereof, the hole or the cavity is filled with a macromolecular compound in a liquid state a freezing point of which exceeds a freezing point of water or a gel-like object constituted by mixing the macromolecular compound with a fine powder and the hole or the cavity is solidified by freezing the macromolecular compound to thereby prevent invasion of a foreign matter or contamination.

According to the invention, a material of an article constituting an object is not restricted but includes a material a surface of which has to be protected such as metals, nonmetals, organic substances, inorganic substances or the like. For example, there are included metals represented by iron species, copper species, aluminum species, titanium species, silicon species, germanium species and so on, plastic species, glass species, carbon species, ferrite species, ceramic species, or composite materials of two kinds or more of these, rock crystal, quartz, diamond, CBN, ruby, sapphire and so on regardless of materials and regardless of shapes and dimensions.

As a specific example of an article, an object thereof is constituted by all the articles required to have a mirror face degree or cleanness of a surface such as a semiconductor wafer, a semiconductor element, a light guide plate or a glass plate, or lenses and the like of a liquid crystal screen. Not only a material of an article but also an article constituting a mirror finish face which has already been worked. There is included a semiconductor wafer or a semiconductor element constituting an assembly by being integrated with various micro machines represented by an acceleration sensor or the like.

Also a working method is not limited but includes machining, various grindings of cutting, surface grinding, formulation grinding, creep grinding, cylindrical grinding and the like, turning, polishing, lapping, cutting using a milling machine, a grindstone, a wire saw or the like, slicing, dicing, milling, grooving, boring, ultrasonic machining, electric spark machining, engraving and so on regardless of modes thereof.

According to a first aspect of the invention, in a normal state, a protecting member comprises a macromolecular compound constituting a liquid state in normal state and having a freezing point higher than that of water, a gel-like object constituted by mixing the macromolecular compound and a fine powder, or a sheet-like object impregnated or coated with the macromolecular compound in the liquid state and therefore, the protecting member is arranged to an object member and frozen (solidified) by cooling the macromolecular compound and simultaneously firmly adhered to a face of the object member and a stable solid phase protecting film or protecting layer can be formed.

In processing to coat the protecting member, the protecting member does not need to be heated or melted and therefore, the covering processing is simple, further, even when working fluids are supplied to a working point or working means in working the article, the protecting film or protecting layer is not dissolved but rather becomes solid by being maintained to be frozen and therefore, the working can smoothly be carried out. Further, although in working, a coolant solution for removing working heat is frequently used, even when the coolant solution is contaminated by a foreign matter (working chips, foreign matters worn off or detached from a tool), the surface of the worked object is prevented from being damaged or contaminated by the protecting film or protecting layer in a solid phase and therefore, the coolant solution can repeatedly be reused. Therefore, a considerable reduction in cost can be achieved in comparison with a current system in which the coolant solution cannot be reused and a fresh coolant solution with a high purity is supplied to a working portion to be abandoned.

Even after working, when the worked object is maintained in a pertinently cooled state, the protecting film or protecting layer is maintained in a solid phase and therefore, a surface of the object member can pertinently be protected even in moving, carrying or storing the object member.

Further, when the surface of the article does not need to be protected, a temperature of the article may be brought into a temperature higher than the freezing temperature of a macromolecular compound, for example, normal temperature, thereby, the macromolecular compound recovers to the liquid state and therefore, it is very simple to release the article from being protected. Depending on cases, the worked object may positively be heated, thereby, the macromolecular compound is evaporated and therefore, cleaning is not needed at all.

When a gel-like object constituted by mixing the macromolecular compound and a fine powder is used as a protecting member, there is achieved an advantage of capable of forming a thick protecting film or protecting layer by presence of the fine powder, further, also chipping or warp back which is liable to be brought about on a surface constituting an object of protection on an upper side of a cutting face when the worked object is cut can be restrained and therefore, a working accuracy is improved.

When a sheet-like object impregnated or coated with the liquid state macromolecular compound or a gel-like object is used as a protecting member, a thickness and a strength of the protecting member are increased and therefore, a surface thereof can further firmly be protected, further, owing to the sheet-like object, a working position or line can be indicated on the face by marking and therefore, the sheet-like object can be worked accurately. Further, a foreign matter can be caught by the sheet and therefore, when the protection is released, the foreign matter can be removed by being accompanied by the sheet and the face constituting the object can firmly be prevented from being adhered with the foreign matter again or damaged thereby.

Further, the sheet-like object constitutes a backup member for the article and therefore, even when the article is extremely thin to be equal to or smaller than, for example, 100 micrometers, a thickness, a strength and a rigidity in a total thereof are increased and the article can easily and safely be moved, carried, handled or the like. Also in a step of releasing protection, when the article is heated to a temperature higher than the freezing temperature of the macromolecular compound, the macromolecular compound recovers to the liquid state and therefore, the sheet-like object can easily be exfoliated.

According to a second aspect of the invention, since the protecting member is in the liquid state or in the gel-like state in a normal state and therefore, the protecting member excellently permeates to corners of a small hole or cavity, the protecting member is solidified by being frozen under the state, and embeds the hole or the cavity, thereby, invasion of foreign matter or dust or contamination from outside can be prevented.

Further, although a strength of the article having the hole or the cavity is reduced in view of a structure thereof, and the article is frequently difficult to withstand a working force, since the protecting member is frozen to be solidified in the hole or the cavity, the strength of a total of the worked object is increased and working of machining, grinding, cutting or the like is facilitated. Further, chippings or burrs can firmly be prevented from being brought about and therefore, a working efficiency and a working accuracy can be increased.

Further, the filled object is maintained as in a solid state when the filled object is maintained in a state of being pertinently cooled even after working and therefore, a worked product can stably be maintained even in moving, carrying, or storing the product. When protection is not needed, the article may be stopped to be cooled to be brought into a temperature of exceeding the freezing temperature of the macromolecular compound, thereby, the protecting member recovers to the liquid state and flows out from the hole or the cavity and therefore, the protecting member is very simply removed. Since the mixed fine powder is water soluble, when the protection is released, the fine powder does not remain in the hole or the cavity as a foreign matter and the article can be brought into a clean state without cleaning the article particularly carefully.

The macromolecular compound in the liquid state the freezing point of which exceeds that of water is a silicone oil represented by a low molecular weight silicone oil or is a compound whose major component is the silicone oil.

According to the silicone oil whose major component is the silicone oil represented by the low molecular weight silicone oil or a cyclosilicone oil, a surface tension thereof is extremely smaller than that of water and is normally equal to or smaller than ¼ of that of water, wettability thereof is excellent and the silicone oil is instantaneously widened over the face constituting protection by capillary phenomenon. Therefore, even when the hole or the cavity is bent or the surface is complicated owing to recesses and projections, the silicone oil excellently permeates to corners and can embed the hole or the cavity without gap. Therefore, operation of coating or filling the silicone oil for forming the protecting film is extremely facilitated.

Further, according to the silicone oil whose major component is the silicone oil represented by the low molecular silicone oil or the cyclo silicone oil, the freezing point is higher than that of water and when the freezing temperature is reached, the silicone oil is instantaneously changed from the liquid phase to the solid phase and manifests an excellent adhering property. Therefore, the protecting film can be formed simply and in a short period of time.

Further, since the freezing point exceeds that of water, not only when a face coated thereby is at less than 0° C. but also when the face is at a temperature exceeding 0° C., the face is solidly covered and therefore, there is provided a protecting force capable of sufficiently withstanding a strong machining force.

Further, the protecting member of the invention is extremely deficient in the affinity with water. Therefore, even when a water soluble or oily working fluid including an antifreezing fluid or the like is injected or blown to the tool and the worked object, there is not a danger of dissolving the protecting film or the protecting layer at all and therefore, there is not a concern of losing a function of protecting the surface of the worked object in working and the surface of the worked object can firmly be protected. Further, even when the working fluid is concentrically supplied to the working local portion, the protecting film or the protecting layer is not dissolved and therefore, properties of the working fluid of removing working heat, lubricating and evacuating cut powders or abrasive grains can sufficiently be achieved and further, the worked object can be prevented from being damaged by the cut powders or the detached abrasive grains.

The gel-like substance having the major component of the macromolecular compound and mixed with the fine powder comprises a cream-like object or a paste-like object blended with a silicone oil represented by the low molecular silicone oil or a liquid state object whose major component is the silicone oil and a solid particle by a ratio of (9:1) through (5.1:4.9).

According thereto, the protecting layer having the large thickness can be formed, the solid particle is operated as a kind of a framework and therefore, a surface protecting force is much strengthened, even when a foreign matter is strongly impacted thereto, the protecting layer can be prevented from being damaged, and even when a working force exerted to the worked object is strong, the surface can stably be protected. Further, when the protecting member fills the hole or the cavity, a strength of a total of the worked object can be increased.

Although other characteristic and advantage of the invention will become apparent by the following detailed description, so far as the basic characteristic of the invention is provided, the invention is not limited to constitutions shown in embodiments but it is apparent that a skilled person can variously change and modify the invention without deviating from the range of the invention.

BRIEF DESCRIPTION OF THE DRAWINGS

FIG. 1-A is an explanatory view showing a first example of a protecting member according to the invention.

FIG. 1-B is an explanatory view showing a second example of a protecting member according to the invention.

FIG. 1-C is an explanatory view showing a third example of a protecting member according to the invention.

FIG. 1-D is an explanatory view showing a fourth example of a protecting member according to the invention.

FIG. 2-A is a perspective view showing an example of article constituting an object of protection according to the invention.

FIG. 2-B is a perspective view showing an example of an article constituting an object of protection according to the invention.

FIG. 2-C is a perspective view showing an example of an article constituting an object of protection according to the invention.

FIG. 2-D is a perspective view showing an example of an article constituting an object of protection according to the invention.

FIG. 3-A is a side view exemplifying a method of forming a protecting film or a protecting layer in a liquid phase state.

FIG. 3-B is a side view exemplifying a method of forming a protecting film or a protecting layer in a liquid phase state.

FIG. 3-C is a side view exemplifying a method of forming a protecting film or a protecting layer in a liquid phase state.

FIG. 3-D is a side view exemplifying a method of forming a protecting film or a protecting layer by using the protecting member of the fourth example.

FIG. 4-A is a side view showing an example of a step of freezing a protecting film or a protecting layer.

FIG. 4-B is a side view showing other example of a step of freezing a protecting film or a protecting layer.

FIG. 5-A is a sectional view of a solidified protecting film or protecting layer when a specific liquid object is used as a protecting member.

FIG. 5-B is a view enlarging a portion thereof.

FIG. 5-C is a side view of a solidified protecting film or protecting layer when a specific gel-like object is used as a protecting member.

FIG. 5-D is a view enlarging a portion thereof.

FIG. 5-E is a sectional view of a solidified protecting film or protecting layer when a specific sheet-like object is used as a protecting member.

FIG. 5-F is a view enlarging a portion thereof.

FIG. 6-A is a perspective view showing a working example in a state of being protected by a solidified protecting film or protecting layer of a specific liquid object.

FIG. 6-B is a sectional view enlarging a portion thereof.

FIG. 6-C is a perspective view showing a working example in a state of being protected by a solidified protecting film or protecting layer of a specific gel-like object.

FIG. 6-D is a sectional view enlarging a portion thereof.

FIG. 6-E is a perspective view showing a working example in a state of being protected by a solidified protecting film or protecting layer of a specific sheet-like object having an impregnating property.

FIG. 6-F is a sectional view enlarging a portion thereof.

FIG. 6-G is a perspective view showing a working example in a state of being protected by a solidified protecting film or protecting layer of a specific sheet-like object having an impregnating property.

FIG. 6-H is a sectional view enlarging a portion thereof.

FIG. 7-A is a partially sectional view showing a state of starting to release protection.

FIG. 7-B is a partially sectional view of a state of having been released from protection.

FIG. 8 is a perspective view showing other working example.

FIG. 9-A is a perspective view showing other surface protecting example and working example.

FIG. 9-B is a sectional view enlarging a portion thereof.

FIG. 9-C is a perspective view showing other surface protecting example and working example.

FIG. 10-A is a plane view showing other surface protecting example.

FIG. 10-B is a sectional view thereof.

FIG. 10-C is a plane view showing a working state.

FIG. 10-D is a plane view showing other protecting example.

FIG. 11-A is a plane view showing a protecting state when an article includes a hole or a cavity.

FIG. 11-B is a sectional view showing a working state.

FIG. 12-A is a plane view showing a protecting state when an article includes a hole or a cavity.

FIG. 12-B is a sectional view showing a working state.

FIG. 12-C is a sectional view showing another working state example.

FIG. 13-A is a plane view showing a protecting state when an article includes a hole or a cavity.

FIG. 13-B is a sectional view showing a working state.

FIG. 14-A is a plane view showing a protecting state when an article includes a hole or a cavity.

FIG. 14-B is a sectional view showing a working state.

FIG. 15-A is a sectional view showing an application example of the invention.

FIG. 15-B is a sectional view of a state of being used as a protecting member.

DETAILED DESCRIPTION OF THE PREFERRED EMBODIMENTS

Embodiments of the invention will be explained in reference to the attached drawings as follows.

FIG. 1 shows an example of a protecting member 1 according to the invention, FIG. 1-A shows a macromolecular compound 1A in a liquid state a freezing point of which exceeds that of water. FIG. 1-B shows a gel-like object 1B represented by a cream-like state, a paste-like state or the like in which a fine powder (solid particle) 2 is added to mix with the macromolecular compound 1A in a liquid state the freezing point of which exceeds that of water. FIG. 1-C shows a sheet-like object 1C impregnated with the macromolecular compound 1A in the liquid state or the gel-like object 1B. FIG. 1-D shows the sheet-like object 1C coated with the macromolecular compound 1A in the liquid state or the gel-like object 1B.

The liquid state macromolecular compound (hereinafter, referred to as specific liquid state object) 1A signifies a macromolecular species freezing agent a freezing point of which is higher than that of water, and which is provided with properties of not-shrinking in freezing, and of having extremely small surface tension and water repellency. Representatively, octamethyltetrasiloxane, that is, silicone oil referred to as low molecular weight silicone oil or tetramer of cyclosilicone oil, cyclopolydimethylsiloxane, cyclodimethylsilicone oil, or a compound whose major component is constituted by those are pointed out.

Such silicone oil is provided with a property of being frozen at a temperature near to normal temperature, and is provided with physical properties in which thermal stability thereof is excellent, the silicone oil is provided with respective properties of chemical resistance, oxidation resistance, electric insulating property, and is harmless for the human body, further, a surface tension thereof is smaller than that of water, excellent water repellency is shown, further, normally, a specific weight thereof is lighter than that of water and the silicone oil can be cleaned off after working by a detergent of a kind used in a general household. A silicone oil whose major component is a cyclo shaped pentamer or a silicone oil whose major component is a cyclo shaped hexamer is inappropriate since a freezing point thereof is lower than a freezing point of water.

When a specific example is shown, for example, a low molecular weighted silicone oil whose major component is cyclopolydimethylsiloxane is constituted by a colorless transparent liquid and is provided with properties in which a viscosity (25° C.) thereof is 2.4 cSt (m²/S), a freezing point thereof is 17° C., a refractive index (25° C.) thereof is 1,394, a surface tension thereof is 19.0 {1.90} dyn/cm {MN/cm}, and a specific weight thereof is 0.95 (25° C.).

Although the silicone oil is referred to as 'oil', the silicone oil is a liquid state macromolecular compound in which molecules are aligned in a chain-like shape by constituting a framework thereof by siloxane bond of alternately aligning silicon and oxygen, and is a substance quite different from a concept of so-to-speak oil comprising, as a raw material, petroleum, mineral oil or the like. Further, although the specific liquid state object 1A is preferably constituted by only silicone oil, a composition whose major component is constituted by it and which is added with other substance as desired is included in the specific liquid state object 1A.

Next, the gel-like object 1B (hereinafter, referred to as specific gel-like object) is constituted by adding a solid particle 10b to the liquid state macromolecular compound 1A and a fine powder or an ultra fine powder having a mean particle size equal to or smaller than 10 μm, further preferably, a mean particle size equal to or smaller than 1 μm, further preferably, a mean particle size equal to or smaller than 0.5 μm is used for each powder.

As the solid particle, generally, powders of earths represented by diatom earth, sugars, powders of rice, wheat or the like, starches, salts, coral powders, wood ash, ash produced by burning paper or fiber, white carbon, zeolite, fly ash, silica or the like are pointed out as preferable examples. Otherwise, powders constituted by ceramic, silicon, ferrite, carbon, graphite, glass, stone, gypsum, plastic, cotton, wood, pulp, paper and the like can also be used.

For example, diatom and powders of rice, wheat or the like, starches are constituted by fine particles and provided with light specific weights and therefore, the powders are uniformly mixed to disperse in the specific liquid state object 1A, and difficult to be separated therefrom and inexpensive and therefore, the powders are recommendable. A number of kinds of the solid particles can be mixed to use. Further, for example, a small amount of a surfactant may be added other than the solid particles in order to promote to separate from the worked object in cleaning the worked object after machining.

When used for protecting the surface, it is recommendable to use a water-soluble solid particle in order to prevent even a small amount of solid particles from remaining on a face constituting an object of protection. Although when used as a packing member of a hole, a recess or a cavity, it is most preferable to use the specific liquid state object 1A such that a residue does not remain, in a case of using the gel-like object 1B, it is indispensable that the solid particle is water soluble. As an example of such a solid particle, sugar, sodium carbonate, salts are preferable and also grain powders of rice, wheat or the like can also be used.

The solid particle functions as a kind of a framework in freezing as a viscosity thereof is increased and a strength thereof in freezing is increased substantially in proportion to an added amount. Therefore, it is preferable to add at least about 5 wt % to the specific liquid state object 1A as the major component. However, when the added amount is excessively large, the fluidity is deteriorated and therefore, the solid particle is difficult to be coated or filled. Hence, generally, a ratio of the liquid state macromolecular compound 1A to the solid particle (powder) is preferably selected from a range of (9:1) through (6.1:4.9) and by the ratio of blending the solid particle, the specific liquid state object 1A is changed from a slurry-like state to a cream-like state through a paste-like state.

The sheet-like object (including a plate-like state object. Hereinafter, referred to as specific sheet-like object) 1C is constituted by impregnating or coating the specific liquid state object 1A or the specific gel-like object 1B to the sheet-like base member 10c. Although as the sheet-like base member 10c for impregnating the specific liquid state object 1A or the specific gel-like object 1B, the sheet-like base member 10c of fiber species of papers, cloths (including nonwoven cloth) which is comparatively thin and is of, for example 2 mm or smaller, or in a porous state or in a net-like state is preferable, other than the sheet-like base member 10c having a soft property, the sheet-like base member 10c in a plate-like shape having a rigidity is also included.

There is used the sheet-like base member 10c to be coated with the specific liquid state object 1A or the specific gel-like object 1B which is hard as in lath plastic, carbon, silicon, ferrite, glass, ceramic or the like without an impregnating property, having a thickness of, for example, about 0.5 through 2 mm. In these cases, the specific liquid state object 1A or the specific gel-like object 1B is coated on a face to be adhered to the face constituting the object of protection. A film or a sheet of plastic is not preferable as a surface protecting member in working since the film or the sheet is liable to adhere around a tool.

FIG. 2 shows examples of shapes of members constituting objects of protection, FIG. 2-A shows a plate-like shape or a sheet-like shape, FIG. 2-B through FIG. 2-D show a rod-like shape, a pillar-like shape and a block-like shape. As a specific example of FIG. 2-D, a prism lens of an optical pickup of DVD or the like is pointed out. As an example of a plate member of FIG. 2-A, a light guide plate, a glass plate or a low pass filter or the like of a liquid crystal screen is pointed out.

(With Regard to First Aspect of Invention)

The mode shows a case of protecting a surface of the object 2 constituting an object of protection, for example, a worked object (hereinafter, referred to as worked object), a surface 20 needing protection is normally a face subjected to working and a vicinity thereof, for example, an upper face or a side face or both of them. The surface 20 is covered by the protecting member 1 to provide a protecting film or a protecting layer and at this stage, the protecting film or the protecting layer is not in a solid phase.

Although it is preferable to previously fix the worked object 2 to a fixing face 4 of a table, a stage or the like of a working machine at this stage, the worked object 2 may be fixed in a state of being mounted to a plate out of the machine.

A method of fixing the worked object 2 is arbitrary and is fixed directly by a vacuum chuck, a magnet chuck, a freezing chuck, or a mechanical clamp, or fixed by an adhering agent of U.V.wax, paraffin or the like and other adhering agent by way of a pallet, or fixed by way of adhesive tape (U.V.tape, other tape made of plastic and other adhesive tape) by using a vacuum chuck.

A method of applying the protecting member at the face 20 needing protection is arbitrary and may pertinently be selected in accordance with a kind of the protecting member 1 to be used. The protecting member may be dropped from a vessel 3a of a pipette or the like as shown by FIG. 3-A, may be sprayed by using a spray vessel 3b as shown by FIG. 3-B, or may be coated by a brush, a knife or a roller 3c as shown by FIG. 3-C.

When the protecting member is the specific liquid state object 1A, owing to properties that surface tension is very small and the wettability is excellent, the specific liquid state object 1A is instantaneously widened on the face constituting the object of protection to constitute a film by a capillary phenomenon and therefore, the coating operation can be carried out in a very short period of time.

When the protecting member is the specific sheet-like object 1C, as shown by FIG. 3-D, by covering the specific sheet-like object 1C on the face 20 needing protection, the specific sheet-like object 1C is brought into close contact therewith by an interface attraction force. When the dried sheet-like base member 10c is provided with impregnability, the specific liquid state object 1A or the specific gel-like object 1B may be impregnated in a state of being covered on the face 20 needing protection.

Further, in the covering operation, it is necessary to bring at least the face 20 needing protection of the member constituting the object of protection into a dried state to maintain a temperature higher than a freezing temperature of the specific liquid state object 1A. The operation is simple since normally, the temperature may be normal temperature.

Next, the protecting member 1 is cooled and the specific macromolecular compound which is a constituent element of the protecting member 1 is solidified and frozen. The cooling method is arbitrary such as an air cooling method, a water cooling method or an air and water cooling method or the like.

FIG. 4 shows the example and it is preferable that in the case of the water cooling method, the method is carried out indirectly. As shown by FIG. 4-A, a protecting film or protecting layer 100 in a liquid state or in a gel-like state formed by an arbitrary one of the protecting members is covered by waterproofing means, for example, a thin waterproof sheet 4 of a plastic film, a metal foil or the like and under the state, a cold medium C, for example, cold water is scattered or sprayed.

In the case of air cooling, as shown by FIG. 4-B, as waterproofing means, a shield hood 4' is covered on the worked object 2 by being spaced apart from each other and a cold medium C in a gaseous state is supplied into the shield hood 4'. Otherwise, the protecting member 1 may be cooled by way of the worked object 2.

The cooling temperature signifies a temperature lower than a freezing point of the protecting member 1, that is, the temperature at which frozen molecules of the protecting member are densely bonded and a fixing force (holding force) by adhesion with the face 20 needing protection can sufficiently withstand a load by machining and in a normal case, the temperature equal to or lower than the freezing temperature of the protecting member by at least 3° C., preferably 5° C.

The protecting film or protecting layer 100 in the liquid state or in the gel-like state is brought into a hard solid phase and is solidly adhered to the face 20 needing protection since the specific macromolecular compound as a constituent component is instantaneously frozen by being cooled.

FIG. 5 shows a state of forming the solid phase protecting film or solid phase protecting layer 101, FIGS. 5-A, B show a case that the protecting member is the specific liquid state object 1A, FIGS. 5-C, D show a case that the protecting member is the specific gel-like object 1B, and FIGS. 5-E, F show a case that the protecting member is the specific sheet-like object 1C. When the protecting member is the specific liquid state object 1A, a thickness of the solid phase protecting film or solid phase protecting layer 101 is normally 20 through 30 cm.

The reason of indirectly cooling the protecting film or protecting layer 100 in the liquid state or the gel-like state by covering the protecting film or protecting layer 100 by the waterproof sheet 4 is that since the specific weight of the specific macromolecular compound is smaller than that of water, when water is directly scattered or brown to the protecting film or protecting layer 100 in the liquid state or in the gel-like state, the water particle gets into a lower layer in a thickness direction of the protecting film or protecting layer 100 in the liquid state or in the gel-like state, the protecting film or protecting layer 100 is locally floated up from the face to be protected to be sporadic in an island-like shape and is partially bulged or becomes irregular by being frozen as it is and the intended protecting layer is not formed. The waterproof sheet 4 can prevent occurrence of such a drawback and can form a uniform, excellent and firmly stabilized solid phase protecting film or solid phase protecting layer 101. Further, when the cooling method is as shown by FIG. 4-A, the waterproof sheet 4 is exfoliated during a time period until starting the working operation. In the case of FIG. 4-B, the shield hood 4' is removed.

Further, aimed working is carried out while maintaining the state of the solid phase protecting film or solid phase protecting layer 101. FIG. 6 shows the example, and FIGS. 6-A, B show an example of forming the frozen protecting film 101 at an upper face of the worked object 2 by using the specific liquid state object 1A as the protecting member and cutting to slice the worked object 2 by a tool 5, for example, a cutting grindstone. FIGS. 6-C, D show an example of forming the frozen protecting layer 101 on the upper face of the worked object 2 by using the specific gel-like object 1B as the protecting member and cutting to slice the worked object 2 by the tool 5, for example, a cutting grindstone. FIGS. 6-E, F show a case of forming the frozen protecting layer 101 on the upper face of the worked object 2 by using the specific sheet-like object 1C of the impregnating type as the protecting member and cutting to slice the worked object 2 by the tool 5, for example, a cutting grindstone. FIGS. 6-G, H show a case of forming the frozen protecting film 101 on the upper face of the worked object 2 by using as a protecting member the specific sheet-like object 1C of the coating type and cutting to slice the worked object 2 by the tool 5, for example, a cutting grindstone.

In order to maintain the solid phase protecting film or solid phase protecting layer 101 during the working operation, the temperature of the face constituting the object of protection is made to be a temperature lower than the freezing point of the protecting layer by cooling the protecting layer byway of the worked object, or continuously supplying a working fluid or a cooling gas to a working point or the tool.

As the working fluid, a liquid cooled to an arbitrary temperature lower than the freezing temperature of the protecting member, as well as a mixture of a liquid and a gas, for example, mist added and mixed with cooling pressurized air having a temperature equal to or lower than 0° C. and a pressure of 5 through 7 kg/cm² are pointed out.

Since the solid phase protecting film or solid phase protecting layer 101 is provided with the water repellency, even when the working fluid is used, the solid phase protecting film or solid phase protecting layer 101 is not dissolved by the working fluid but rather maintained in a stable solid phase state, further, is not exfoliated from the face 20 constituting the object of protection even exerted with a working force and a tight adhering state is maintained.

Therefore, even when a cutting chip in the worked object 2 flied to, is brought into contact with, is impacted to, or abrases the face 20 constituting the object of protection, or even when a foreign matter N of an abrasive grain, a worn powder or the like detached from the tool 5 flies to, is brought into contact with, is impacted to, or abrases the face 20 constituting the object of protection during the working operation as shown by FIGS. 6-B, D, F, H, the face 20 constituting the object of protection is covered by the dense hard solid phase protecting film or solid phase protecting layer 101 and therefore, the face 20 is not damaged or contaminated by the foreign object N.

Further, even when the working fluid is frozen during the working operation to be ice, since the solid phase protecting film or solid phase protecting layer 101 is provided with the water repellency, ice is not generated or laminated on the surface of the worked object. Further, since the solid phase protecting film or solid phase protecting layer 101 is solidly adhered to the face 20 constituting the object of protection, occurrence of chippings or burrs on the upper side of the cutting face can be reduced.

Further, the protecting member of the invention is provided with the freezing point higher than the freezing point of water and can normally be solidified stably on the face 20 constituting the object of protection even at a temperature equal to or higher than 0° C. and therefore, the protecting member can be maintained to be fixed sufficiently by cooling operation by a fluid represented by the working fluid as described above and therefore, the protecting member of the invention is advantageous also in view of cost.

When the solid phase protecting film or solid phase protecting layer 101 is formed by freezing the specific gel-like object 1B, the viscosity of the mixed solid particle 10b is increased and therefore, a thick layer can be formed, further, also the strength of the protecting layer per se is increased. Therefore, even when the face 20 constituting the object of protection is provided with a property of being very easy to be damaged, the face 20 constituting the object of protection can firmly be protected.

Further, when the solid phase protecting film or solid phase protecting layer 101 is the specific sheet-like object 1C compounded with the specific macromolecular compound, the protecting layer is constructed by a constitution of being doubly strengthened and therefore, the worked object can be prevented from being damaged or contaminated by foreign matters of cutting chips, abrasive grains and the like or contamination. Further, the specific sheet-like object 1C can also be functioned as marking means, when the thick sheet-like object 1C is used, even when the worked object 2 is thin, the sheet-like object 1C functions also as a backup member thereof and therefore, the worked object 2 can easily and safely be handled, carried, moved.

In the case of finishing the working operation as described above, when the face 20 constituting the object of protection is maintained at a temperature lower than the freezing temperature of the specific macromolecular compound, the solid phase protecting film or solid phase protecting layer 101 maintains a state of being adhered to the worked face 20 constituting the object of protection. Therefore, even when the worked object is moved or carried to a succeeding step, the face 20 constituting the object of protection can be protected from being adhered with or damaged by a foreign matter.

Further, when protection of the face 20 constituting the object of protection is no longer needed, a temperature of the face 20 constituting the object of protection may be constituted by a temperature exceeding the freezing temperature of the specific macromolecular compound, thereby, the specific macromolecular compound is changed from the solid phase to a liquid phase and the solid phase protecting film or solid phase protecting layer 101 can simply be detached from the face 20 constituting the object of protection.

FIG. 7 shows a state at the occasion, when heat T is operated to the solid phase protecting film or solid phase protecting layer 101 of the worked object 2' constituting a product as shown by FIG. 7-A, the solid phase protecting film or solid phase protecting layer 101 is melted to recover to an original state (liquid state, gel-like state object) as shown by FIG. 7-B and the protecting member 1 recovered to the liquid phase is detached from the face 20 constituting the object of protection along with chipped powders, detached abrasive grains and the like.

In the case of the specific sheet-like object, a main constituent object of the protecting member recovers to the liquid state, the gel-like state and the sheet-like base member 10c is floated up and therefore, and therefore by picking up the sheet-like base member 10c by tweezers or the like, the sheet-like base member 10c can be removed from the face constituting the object of protection. A foreign matter is adhered to or caught by the sheet-like base member 10c and therefore, there is not a danger of damaging or contaminating the face constituting the object of protection by the foreign matter.

Further, a method of elevating the temperature of the face 20 constituting the object of protection to a temperature exceeding the freezing temperature of the specific macromolecular compound is arbitrary, for example, the face 20 constituting the object of protection may naturally be defrosted by stopping to supply the working fluid or the cooling gas and leaving the face 20 constituting the object of protection until the temperature becomes a normal temperature, or water at normal temperature or warm water may be scattered or warm wind may be brown positively, or the face 20 constituting the object of protection may be dipped in water at normal temperature or warm water or the like. Or, the face 20 constituting the object of protection may positively be heated by charging the face 20 constituting the object of protection in an oven or the like. According thereto, the specific macromolecular compound is evaporated and therefore, a cleaning step can be omitted.

When the face 20 constituting the object of protection is put into a tank filled with water at a temperature higher than the freezing point or a kind of a detergent for household use, the specific weight of the protecting member 1 is lighter than that of water, the protecting member 1 is not provided with an affinity with water and therefore, the protecting member 1 is separated from water to be floated up onto a water surface, chipped powders or detached abrasive grains sink to a bottom of the water tank and therefore, the protecting member 1 can simply be separated. When water is blended with detergents, the protecting member 1 is further rapidly separated from the worked object. Further, when the protecting member 1 is put into a recovery water tank containing water at a temperature lower than the freezing point of the protecting member 1 from the tank, the protecting member 1 is solidified on water. Therefore, the protecting member 1 can simply be recovered by being scooped up by a net or the like and can be subjected to be reused. Therefore, the protecting member 1 can be removed from the worked object with extremely excellent operability and efficiently.

The example of working the worked object while protecting the surface by applying the invention is not specified as described above.

1) For example, the invention is effective even when the worked object 2 is cut to dice longitudinally and transversely as shown by FIG. 8 to provide a small product in a chip-like shape.
2) The invention is effective also in the case of boring the worked object 2 by the tool 5 of a drill or the like as shown by FIG. 9-A, or machining the worked object 2 by polishing, cutting or the like by a grindstone, a metal saw or the like.
3) Also a case of using the protecting member when a material in a wafer-like shape is worked is pointed out as a preferable example of use. For example, when an element of a CCD camera lens is separated from a material in the wafer-like shape by dicing to cut the element, or when the worked object 2 of a wafer or the like mounted with a semiconductor circuit element is diced, in the case of working the worked object 2 as it is, a surface and a recess or the like are damaged and contaminated by an outside foreign matter, contamination of an abrasive grain detached from a grindstone or a cut chip of a cut product or an outside foreign matter or dust.

In order to prevent the contamination or the damage, as shown by FIGS. 10-A, B, D, a surface and/or a side face of the wafer constituting the worked object 2 needing protection is previously covered by any of the specific liquid state object 1A, the specific gel-like object 1B or the specific sheet-like object 1C as the protecting member 1.

Further, the solid phase protecting film or solid phase protecting layer 101 is formed by cooling to solidify the macromolecular compound as described above. Under the state, the lens element or the semiconductor circuit element of the face 20 constituting the object of protection is worked by the tool 5 of a cutting grindstone or the like and protected by the solid phase protecting film or solid phase protecting layer 101. Thereby, a surface or a recess or the like thereof can be prevented from being damaged or contaminated by an outside foreign matter, an outside foreign matter of an abrasive grain detached from a grindstone, a cut chip of a cut product or contamination or dust or the like.

The solid phase protecting film or solid phase protecting layer 101 also serves to prevent a portion of the semiconductor lens element, the circuit element or the like separated during the working operation from being detached from the base member of the worked object 2 to roll on the surface to damage the surface.

Further, also when a surface of a mirror-finished worked object, for example, a dial of a time piece is subjected to secondary working of spot facing or the like, a mirror-finished portion can be protected by covering a surface and/or a side face needing protection with any of the specific liquid state object 1A, the specific gel-like object 1B, or the specific sheet-like object 1C as the protecting member 1 and by freezing to adhere the protecting member 1 in cooling the protecting member 1 as described above to form a solid phase protecting film or a solid phase protecting layer 101.

When a specific example of protecting a worked object by applying the first aspect of the invention is shown, a worked object is constituted by a material: BK7 optical glass and dimensions: 50×50×1 mm.

As a protecting member, there is used a low molecular silicone oil whose major component is cyclopolydimethylsiloxane as a specific liquid-like object. The specific liquid-like object is constituted by a colorless transparent liquid having a viscosity (25° C.) of 2.4 cSt (m$^2$/S), a freezing point of 17° C., a refractive index (25° C.) of 1,394, a surface tension of 17.8 dyn/cm, and a specific weight of 0.95 (25° C.)

In a state of fixing the worked object to a table by an adhesive tape, the specific liquid state object is coated on an upper face and a side face of a worked member by a brush to constitute a film thickness of about 20 micrometers. Under the state, a thin waterproof sheet made of plastic is covered, water at 5° C. is sprinkled to cool, and a protecting film which has been in the liquid state is frozen. A required period of time is 10 seconds.

A kind of working is constituted by cutting to dice and working to provide a piece of 5×5 mm. As a tool, there is used one sheet grindstone of a resin bond diamond grindstone (grain size #280) having tool dimensions of an outer diameter of 100 mm and a thickness of 0.4 mm. Working conditions are constituted by a grindstone revolution number: 800 rpm, a table feed speed of 100 mm/min, and a working method: down cut. During the working operation, a water soluble coolant solution at 4° C. is injected to maintain to freeze the protecting film.

After the working operation, the worked object is recovered to normal temperature to defrost the solid phase protecting film. A surface of a provided product is not damaged at all. When working is carried out without applying the invention for comparison, a number of flaws having a size of several micrometers are brought about at a surface of the worked object.

Further, also when as a protecting member, there is used a low molecular silicone oil having viscosity (25° C.) of 2.5 cSt (m²/S), a freezing point of 10° C., a refractive index (25° C.) of 1.394, a surface tension of 19.0 {1.90} dyn/cm {MN/cm}, a specific weight of 0.95 (25° C.), a thin waterproof sheet made of plastic is covered, water at 2° C. is sprinkled to cool and a protecting film which has been in the liquid state is frozen, an excellent result is provided.

(With Regard to Second Aspect of Invention)

The mode shows a method of protecting a worked object having a hole, a cavity or the like and FIG. 11 through FIG. 14 show the method.

For example, when in a step of mechanical working a worked object 2 having a gap 21 by machining, polishing, cutting, boring or the like, or a semiconductor fabricating step, working chips brought about in working or fabricating, abrasive grains detached from a grindstone, or other various foreign matters, contamination of dust or the like scattered to surrounding are brought into the gap 21, it is extremely difficult to evacuate the foreign matters or contamination to clean at a later stage and a failed product is brought about. Further, also in the case of carrying a product (semiconductor wafer, semiconductor element or the like), when a foreign matter in air invades inside of the gap 21, the quality is deteriorated.

In order to resolve the problem, according to the invention, when the worked object 2 includes the gap 21 of a hole, a cavity or the like such as a small hole in a porous state, the protecting member 1 is previously filled to the gap 21 and frozen to thereby prevent invasion of foreign matters or contamination from outside.

As the protecting member 1 used in the invention, the specific liquid state object 1A shown in FIGS. 1-A, B is most preferable. The specific liquid state object 1A is the most preferable in view of a point that the specific liquid state object 1A permeates corners by a capillary phenomenon and a point that a residue does not remain at all in the hole or the cavity in releasing protection. The specific gel-like object 1B is suitable for a case in which a strength of the worked object is weak by presence of the hole or the cavity. In this case, it is necessary that the solid particle added to the specific gel-like object 1B is water soluble. The explanation of the first invention is applied to an explanation of the specific liquid state object 1A, the specific gel-like object 1B.

FIG. 11 shows a case in which the small hole 21 communicating with outside is present at a portion or a total of the worked object 2, in, for example, cutting or polishing the worked object 2, the hole 21 is filled with the specific liquid state object 1A or the specific gel-like object 1B.

The filling method is arbitrary, when the protecting member is in the liquid state, the protecting member may be injected by a pipette or the like and when the protecting member is in the gel-like state, the protecting member may be injected by a nozzle or coated over a total thereof and pressed by developing the protecting member over a surface thereof by a knife or the like. The specific liquid state object 1A is provided with an excellent permeability and therefore, even when a sectional shape of the hole is complicated, the specific liquid state object 1A is filled to corners.

Next, the worked object 2 is cooled by an arbitrary method described in the first invention and the protecting member 1 is solidified and changed into the solid phase. Numeral 101 designates a solid phase protecting member. Since the specific gel-like object 1B includes the solid particles and therefore, the strength is strengthened.

The worked object 2 is worked by the tool 5 under the state and FIG. 11-B shows a state of polishing the surface 20 of the worked object 2 as an example. In the working operation, the temperature of worked object 2 is maintained to be equal to or lower than the freezing temperature of the specific macromolecular compound by cooling the worked object 2 per se or operating working fluids or the like to the worked object 2. Thereby, since the respective holes 21 are closed by frozen plugs, cut powders, abrasive grains or the like brought about in accordance with polishing do not invade the holes 21. Further, the chippings or the burrs can effectively be avoided by presence of the frozen solid phase protecting member.

Even in moving or carrying the product after working, by maintaining the product at a temperature equal to or lower than the freezing temperature of the specific macromolecular compound, invasion of foreign matters can be prevented and handling thereof can be facilitated.

Further, when protection is not needed, the temperature of the worked object 2 is elevated to a temperature exceeding the freezing temperature of the specific macromolecular compound. The method is arbitrary, for example, the worked object 2 may be dipped in water at normal temperature or warm water. Thereby, the protection member 1 is brought into the liquid state or the gel-like state again to flow out from the hole 21 and therefore, the protection member 1 is easily removed. The explanation of the first invention is applied thereto. Also in the case of the gel-like object, since the solid particle is water soluble, the solid particle is dissolved in water and does not remain in the hole 21 and therefore, pertinent cleanness can be provided.

FIGS. 12-A, B, C show an example of applying the second aspect of the invention to the worked object 2 having a number of the holes 21 partitioned by thin partition walls as in a honeycomb structure, the number of holes 21 are previously filled with the specific liquid state object 1A or the specific gel-like object 1B, next, the worked object 2 is cooled by an arbitrary method, the protecting member 1 is solidified to be changed to the solid phase protecting member 101. Further, the worked object 2 is worked by the tool 5 of a polishing grindstone or the like and the holes are protected such that foreign matters or contamination do not invade the holes in the working operation.

Even when a structure of the worked object 2, as it is, is not provided with a strength of capable of withstanding a working force as in the worked object 2 having the holes in the honeycomb state, the frozen protecting member 1 constitutes a reinforcement member, the strength of a total of the worked object is increased, chippings or burrs can be prevented from being brought about and therefore, the working is facilitated and a working efficiency and a working accuracy can also be promoted.

FIGS. 13-A, B show a case in which the worked object 2 of, for example, a ceramic or glass member or the like is provided with a number of independent projections 2B at a base portion 2A to show a plate in a frog-like shape, the gaps 21 among the projections 2B are previously filled with the specific liquid state object 1A or the specific gel-like object 1B, next, the worked object 2 is cooled by an arbitrary method, and the protecting member 1 is solidified and changed into the solid phase protecting member 101. Further, the worked object 2 is worked by the tool 5 of a polishing grindstone or the like and protected such that foreign matters or contamination do not invade the holes during the working operation.

FIG. 14 shows an example in working the worked object 2 having the cavity 21 at a middle in a thickness direction thereof, the cavities 21 are previously filled with the specific liquid state object 1A or the specific gel-like object 1B, next, the worked object 2 is cooled by an arbitrary method, and the protecting member 1 is solidified and changed into the solid phase protecting member 101. Further, the worked object 2 is worked to be machined, cut, polished or the like by a tool, not illustrated, and is protected such that foreign matters or contamination do not invade the cavities 21. Also in the case, the solid phase protecting member 101 embedded and frozen in the cavities 21 constitutes the reinforcing member to facilitate machining and a working efficiency and a working degree can also be promoted. Further, as other example of FIG. 14, a wafer having a multilayer structure and having a cavity or a gap at inside thereof is pointed out.

A specific example of protecting the worked object by applying the second aspect of the invention is shown as follows.

The worked object 2 is a silicon wafer formed with a semiconductor element, which is constituted by a structure having a hole in a pocket-like shape at inside of each element and bridging a beam of silicon single crystal having a thickness of 5 micrometers at an upper portion of the hole. Dimensions of respective portions of the worked object are as follows.

Size of worked object: 8 inches diameter×thickness of 800 micrometers

Size of element: 5 mm×5 mm×0.8 mm

Size of pocket hole in element: 3×3×depth 0.5 mm

Thickness of beam bridging hole: 5 micrometers

A low molecular silicone oil whose major component is cyclopolydimethylsiloxane constituting a protecting member is used as a specific liquid state object.

The worked object is pasted on an adhesive tape, the specific liquid state object is filled in the pocket hole of each element, and mounted to a thin plate outside of a preparing machine cooled to 3° C. and the specific liquid state object filled in the pocket hole is solidified. Thereafter, the worked object is mounted on a vacuum chuck table of a cutting to dice machine and is cut while applying a cooled coolant solution thereto.

Cutting conditions are as follows.

Grindstone (cutting plate): metal bond diamond grindstone (particle size #600) having outer diameter of 2 inches, thickness of 0.2 mm Spindle revolution number: 30,000 rpm Table feed speed: 1 mm/second, down cut Coolant solution delivery amount: 3 through 5 liters/minute Coolant solution temperature: 3° C.

After cutting operation, when the element is heated at a temperature of 150° C. for about 40 minutes to evaporate the specific liquid state object, the specific liquid state object is completely eliminated. When the worked object is finely inspected, the beam of the element is not destructed at all.

As a result of executing similar working without putting any thing in the hole of the element for comparison, the beam is destructed by vibration of the grindstone to bring about a failed product.

Field of Utilization of the Invention

The invention is preferable for protection against damage or contamination of a surface or a gap in working an industrial product or material and in moving, carrying or storing the product after working and is effective also as temporally protecting means or protecting method against damage or contamination of various articles. That is, the invention also includes a case of protecting a required face of an article in carrying, handling, transporting or storing an article requesting cleanness or mirror finish performance in which the article is not worked.

Taking an example of handling assisting means for carrying, or moving an article when the article is thin, a thickness of a silicon wafer of a semiconductor tends to be thinned to be equal to or smaller than about several 10 μm. Under such a condition, handling thereof becomes extremely difficult and there is a possibility of incapable of handling the silicon wafer by destructing the silicon wafer. Although in a background art, there is not an effective counter major thereof, when the invention is applied, the silicon wafer can extremely easily be handled.

That is, as shown by FIG. 15-A, for example, a member 1' having a strength of carbon in a plate-like shape, or other silicon wafer or the like in a plate-like shape is formed with a film or a layer by the specific liquid state object 1A or the specific gel-like object 1B, a thin layer object 2 which is easy to destruct such as a silicon wafer or the like is arranged thereto and is cooled to a temperature equal to or lower than the freezing temperature of the macromolecular compound under the state. The thin layer object and a reinforcing member are integrated by constituting as adhering member the macromolecular compound solidified thereby, a total of the thin layer object 2 is apparently thickened, the strength is increased and therefore, the thin layer object 2 is easily and safely handled, carried, or moved. When the reinforcement is not needed, the macromolecular compound is simply separated when the thin layer object 2 is heated and the macromolecular compound is brought into a liquid phase from the solid phase.

Further, when the thin layer object 2 is turned upside down as shown by FIG. 15-B, the reinforcement member 1' becomes to be disposed on a top side and functions as the above-described protecting member and therefore, the reinforcement member 1' can be worked smoothly while protecting the surface.

What is claimed is:

1. A protecting method of an article, wherein in working a worked object, a face constituting an object of protection is covered by any of a macromolecular compound in a liquid state a freezing point of which exceeds a freezing point of water, a gel-like object constituted by mixing the macromolecular compound and a fine powder, or a sheet-like object impregnated or coated with the macromolecular compound in the liquid state the freezing point of which exceeds the freezing point of water or the gel-like object, and a protecting film or a protecting layer in a solid phase against damage or contamination by an foreign matter is formed by freezing the macromolecular compound.

2. The protecting method of an article according to claim 1, wherein the macromolecular compound in the liquid state the freezing point of which exceeds the freezing point of water is a silicone oil represented by a low molecular weight thereof or is a compound whose major component is the silicone oil.

3. The protecting method of an article according to claim 1, wherein the protecting film or the protecting layer in the solid phase is formed by covering the macromolecular compound in the liquid phase or in the gel-like state by a waterproof sheet and indirectly cooling the macromolecular compound by operating a cold medium thereto under the state.

4. A protecting method of an article, wherein in working a worked object having a hole or a cavity at inside thereof, the hole or the cavity is filled with a macromolecular compound in a liquid state a freezing point of which exceeds a freezing point of water or a gel-like object constituted by mixing the macromolecular compound with a water soluble fine powder and the hole or the cavity is solidified by freezing the macromolecular compound to thereby prevent invasion of a foreign matter or contamination.

5. The protecting method of an article according to claim 4, wherein the macromolecular compound in the liquid state the freezing point of which exceeds the freezing point of water is a silicone oil represented by a low molecular weight thereof or is a compound whose major component is the silicone oil.

6. A protecting member which is means for protecting a surface of an article, wherein the means comprises any of a low molecular weight silicone oil, a macromolecular compound in a liquid state whose major component is the low molecular weight silicone oil, a gel-like object constituted by mixing the low molecular weight silicone oil or the macromolecular compound with a fine powder, or a sheet-like object impregnated or coated with the low molecular weight silicone oil, the macromolecular compound in the liquid state whose major component is the low molecular weight silicone oil, or the gel-like object.

7. A protecting member of an article which is means for protecting the article having a small hole or a cavity at inside thereof, wherein the means comprises a low molecular weight silicone oil, a macromolecular compound in a liquid state whose major component is the low molecular weight silicone oil, or a gel-like object constituted by mixing the low molecular weight silicone oil or the macromolecular compound with a water soluble fine powder.

* * * * *